(12) United States Patent
Liu et al.

(10) Patent No.: US 12,317,671 B2
(45) Date of Patent: May 27, 2025

(54) ORGANIC LIGHT EMITTING DEVICE HAVING HOLE INJECTION LAYER WITH DOPING CONCENTRATION OF FIRST DOPING MATERIAL GRADUALLY DECREASING IN DIRECTION AWAY FROM ANODE, DISPLAY DEVICE, PREPARATION METHOD AND STORAGE MEDIUM

(71) Applicant: BOE Technology Group Co., Ltd., Beijing (CN)

(72) Inventors: Xinghua Liu, Beijing (CN); Xiaojin Zhang, Beijing (CN); Haiyan Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 638 days.

(21) Appl. No.: 17/532,502

(22) Filed: Nov. 22, 2021

(65) Prior Publication Data

US 2022/0271252 A1     Aug. 25, 2022

(30) Foreign Application Priority Data

Feb. 20, 2021 (CN) .......................... 202110191033.9

(51) Int. Cl.
*H10K 50/17* (2023.01)
*H10K 50/15* (2023.01)
(Continued)

(52) U.S. Cl.
CPC ............ *H10K 50/17* (2023.02); *H10K 50/15* (2023.02); *H10K 71/00* (2023.02); *H10K 71/30* (2023.02); *H10K 2101/80* (2023.02)

(58) Field of Classification Search
CPC ........ H10K 50/17; H10K 50/15; H10K 71/00; H10K 71/30; H10K 2101/80;
(Continued)

(56) References Cited

U.S. PATENT DOCUMENTS 7,164,151 B2 * 1/2007 Yamazaki ............ H10K 59/123
257/E27.111
7,771,843 B2 * 8/2010 Suh ........................ H10K 50/17
428/917
(Continued)

FOREIGN PATENT DOCUMENTS

CN       1713788 A     12/2005
CN       1845355 A     10/2006
(Continued)

OTHER PUBLICATIONS

CN 202110191033.9 first office action.

*Primary Examiner* — Caleb E Henry
(74) *Attorney, Agent, or Firm* — IPro, PLLC (57) ABSTRACT

The present disclosure relates to an organic light emitting device, a display device, a preparation method, a storage medium and a computer equipment. The organic light emitting device includes an anode, an organic layer and a cathode, in which the organic layer includes a hole injection layer, a hole transport layer, an electron blocking layer, an organic light emitting layer, a hole blocking layer, an electron transport layer, and an electron injection layer, which are sequentially arranged in a stack on the anode, in which the hole injection layer includes a first host material and a first doping material doped in the first host material, a doping concentration of the first doping material gradually decreases in a direction away from the anode, and a doping ratio of the first doping material in the hole injection layer is less than or equal to 6%.

6 Claims, 7 Drawing Sheets

(51) Int. Cl.
*H10K 71/00* (2023.01)
*H10K 71/30* (2023.01)
*H10K 101/00* (2023.01)

(58) Field of Classification Search
CPC .. H10K 50/155; H10K 71/164; C23C 14/243; C23C 14/548; C23C 14/12; C23C 14/24
See application file for complete search history.

(56) References Cited

U.S. PATENT DOCUMENTS

| | | | | |
|---|---|---|---|---|
| 9,209,427 | B2* | 12/2015 | Yamazaki | C23C 14/243 |
| 9,458,532 | B2* | 10/2016 | Sonoda | H10K 71/191 |
| 2004/0056590 | A1* | 3/2004 | Lim | H10K 59/876 |
| | | | | 313/506 |
| 2006/0131562 | A1 | 6/2006 | Li | |
| 2010/0323464 | A1* | 12/2010 | Cheon | H10K 71/15 |
| | | | | 438/22 |
| 2013/0056719 | A1* | 3/2013 | Komatsu | H10K 59/122 |
| | | | | 438/34 |
| 2013/0126840 | A1* | 5/2013 | Fujimura | H05B 33/22 |
| | | | | 438/46 |
| 2013/0126842 | A1* | 5/2013 | Takeuchi | H10K 59/80518 |
| | | | | 438/30 |
| 2013/0134474 | A1* | 5/2013 | Takeuchi | H10K 50/17 |
| | | | | 438/22 |
| 2013/0252364 | A1* | 9/2013 | Kawato | C23C 14/562 |
| | | | | 438/46 |
| 2013/0260501 | A1* | 10/2013 | Sonoda | C23C 14/12 |
| | | | | 438/46 |
| 2016/0254330 | A1* | 9/2016 | Uchida | H10K 50/828 |
| | | | | 257/40 |
| 2017/0069790 | A1* | 3/2017 | Choi | H01L 33/16 |
| 2017/0309833 | A1* | 10/2017 | Lei | H10K 50/155 |
| 2018/0086775 | A1* | 3/2018 | Hong | C07D 333/78 |
| 2018/0226024 | A1* | 8/2018 | Tang | H10K 50/11 |
| 2018/0269421 | A1* | 9/2018 | Pan | H10K 50/816 |
| 2019/0081116 | A1* | 3/2019 | Kondo | H10K 71/00 |
| 2019/0267438 | A1* | 8/2019 | Goto | H10K 71/135 |
| 2020/0013977 | A1* | 1/2020 | Wang | H10K 50/17 |
| 2020/0161594 | A1* | 5/2020 | Kondo | H10K 71/00 |
| 2020/0279897 | A1* | 9/2020 | Nendai | H10K 59/35 |

FOREIGN PATENT DOCUMENTS

| | | |
|---|---|---|
| CN | 104241540 A | 12/2014 |
| EP | 3190639 A1 | 7/2017 |
| JP | 2002313583 A | 10/2002 |
| JP | 2008088464 A | 4/2008 |

\* cited by examiner

Fig. 7 respectively opening the first baffle of the first vapor deposition device and the second baffle of the second vapor deposition device, controlling a rate of the first vaporization source of the first vapor deposition device to reach and be stabilized at a first preset rate, and controlling a rate of the second vaporization source of the second vapor deposition device to reach and be stabilized at a second preset rate respectively controlling the first vapor deposition device and the second vapor deposition device to form the first host material of the hole injection layer and the first doping material doped in the first host material on the anode of the organic light emitting device controlling a temperature of the second vaporization source to cool down at a preset cooling rate, and controlling the second baffle to close the second vaporization source at a preset closing rate

ORGANIC LIGHT EMITTING DEVICE HAVING HOLE INJECTION LAYER WITH DOPING CONCENTRATION OF FIRST DOPING MATERIAL GRADUALLY DECREASING IN DIRECTION AWAY FROM ANODE, DISPLAY DEVICE, PREPARATION METHOD AND STORAGE MEDIUM

CROSS-REFERENCE TO RELATED APPLICATION

The present disclosure claims a priority to the Chinese Patent Application No. 202110191033.9 filed on Feb. 20, 2021, the disclosures of which are incorporated in their entirety by reference herein.

TECHNICAL FIELD

The present disclosure relates to the field of display technology, in particular to an organic light emitting device, a display device, a preparation method, a storage medium and a computer equipment.

BACKGROUND

Organic light emitting devices, also known as organic light emitting diode (OLED) or organic electroluminesence display (OLED), refers to the phenomenon that organic semiconductor materials and light emitting materials become luminescent due to carrier injection and recombination when driven by an electric filed. OLED display screens are of characteristics of being light and thin, high brightness, low power consumption, fast response, high definition, good flexibility, and high luminous efficiency, which can meet the new demands of consumers for display technology. More and more display manufacturers around the world have invested in research and development, which has greatly promoted the industrialization process of OLED. However, the existing organic light emitting devices have the problems of high voltage, low luminous efficiency and instability.

SUMMARY

In order to solve at least one of the above problems, a first embodiment of the present disclosure provides an organic light emitting device, including an anode, an organic layer and a cathode, which are arranged in a stack, in which the organic layer includes a hole injection layer, a hole transport layer, an electron blocking layer, an organic light emitting layer, a hole blocking layer, an electron transport layer, and an electron injection layer, which are sequentially arranged in a stack on the anode, in which the hole injection layer includes a first host material and a first doping material doped in the first host material, a doping concentration of the first doping material gradually decreases in a direction away from the anode, and a doping ratio of the first doping material in the hole injection layer is less than or equal to 6%.

Further, the hole transport layer may include a second host material and a second doping material doped in the second host material, a doping concentration of the second doping material may gradually decrease in the direction away from the anode, and a doping ratio of the second doping material in the hole transport layer may be less than or equal to 6%.

Further, the second host material and the first host material may be the same or different, and may be at least one selected from a group consisting of hexaazatriphenylene-hexacarbonitrile, copper phthalocyanine and radialene-based materials.

Further, the second doping material and the first doping material may be the same or different, and may be at least one selected from P-type materials.

Further, the hole injection layer includes a first portion where a doping concentration of the first doping material gradually increases in the direction away from the anode and a second portion where a doping concentration of the first doping material gradually decreases in the direction away from the anode, and the first portion is arranged on a surface of the second portion proximate to the anode.

Further, the hole transport layer includes a third portion where a doping concentration of the first doping material gradually increases in the direction away from the anode and a fourth portion where a doping concentration of the first doping material gradually decreases in the direction away from the anode, and the third portion is arranged on a surface of the fourth portion proximate to the anode.

A second embodiment of the present disclosure provides a display device including the organic light emitting device as described above.

A third embodiment of the present disclosure provides a method for preparing an organic light emitting device, including: forming a hole injection layer, a hole transport layer, an electron blocking layer, an organic light emitting layer, a hole blocking layer, an electron transport layer, and an electron injection layer, which are sequentially arranged in a stack on an anode of the organic light emitting device, in which the hole injection layer includes a first host material and a first doping material doped in the first host material, a doping concentration of the first doping material gradually decreases in a direction away from the anode, and a doping ratio of the first doping material in the hole injection layer is less than or equal to 6%.

A fourth embodiment of the present disclosure provides a preparation system, including a first vapor deposition device, a second vapor deposition device, and a control device that controls the first vapor deposition device and the second vapor deposition device, in which the first vapor deposition device is configured to vapor deposite a first host material of a hole injection layer of an organic light emitting device, and includes a first vaporization source and a first baffle arranged between the first vaporization source and the organic light emitting device; the second vapor deposition device is configured to vapor deposite a first doping material of the hole injection layer of the organic light emitting device, and includes a second vaporization source and a second baffle arranged between the second vaporization source and the organic light emitting device; and the control device is configured to respectively control the first vaporization source and the first baffle as well as the second vaporization source and the second baffle to form a first host material of the hole injection layer and a first doping material doped in the first host material on an anode of the organic light emitting device, so that a doping concentration of the first doping material of the hole injection layer gradually decreases in a direction away from the anode, and a doping ratio of the first doping material in the hole injection layer is less than or equal to 6%.

Further, the second vapor deposition device may further include a first support shaft located outside the second vaporization source and arranged perpendicular to the second vaporization source, and a second support rod arranged on the first support shaft and configured to move the second baffle in a first direction, that the first direction is a horizontal direction.

Further, the second vapor deposition device may further include a second support shaft located outside the second vaporization source and arranged perpendicular to the first support shaft, and a second support rod arranged on the second support shaft and configured to move the second baffle in a second direction that the second direction is a vertical direction.

Further, the preparation system may further include: a third vapor deposition device, configured to vapor deposite a second host material of a hole transport layer; and a fourth vapor deposition device, configured to vapor deposite a second doping material of the hole transport layer.

Further, the preparation system may further include: a fifth vapor deposition device, configured to form an electron blocking layer on the hole transport layer; a sixth vapor deposition device, configured to form an organic light emitting layer on the electron blocking layer; a seventh vapor deposition device, configured to form a hole blocking layer on the organic light emitting layer; an eighth vapor deposition device, configured to form an electron transport layer on the hole blocking layer; a ninth vapor deposition device, configured to form an electron injection layer on the electron transport layer; and a tenth vapor deposition device, configured to form a cathode on the electron injection layer.

Further, the hole transport layer may include a second host material and a second doping material doped in the second host material, a doping concentration of the second doping material may gradually decrease in the direction away from the anode, and a doping ratio of the second doping material in the hole transport layer may be less than or equal to 6%.

Further, the second host material and the first host material may be the same or different, and may be at least one selected from a group consisting of hexaazatriphenylene-hexacarbonitrile, copper phthalocyanine and radialene-based materials.

Further, the second doping material and the first doping material may be the same or different, and may be at least one selected from P-type materials.

A fifth embodiment of the present disclosure provides a method for preparing an organic light emitting device, which uses the above preparation system and includes: respectively opening the first baffle of the first vapor deposition device and the second baffle of the second vapor deposition device, controlling a rate of the first vaporization source of the first vapor deposition device to reach and be stabilized at a first preset rate, and controlling a rate of the second evaporation source of the second vapor deposition device to reach and be stabilized at a second preset rate, in which the second preset rate being 10% of the first preset rate; respectively controlling the first vapor deposition device and the second vapor deposition device to form the first host material of the hole injection layer and the first doping material doped in the first host material on the anode of the organic light emitting device; and controlling a temperature of the second vaporization source to cool down at a preset cooling rate, and controlling the second baffle to close the second vaporization source at a preset closing rate, so that a doping concentration of the first doping material of the hole injection layer gradually decreases in the direction away from the anode, and a doping ratio of the first doping material in the hole injection layer is less than or equal to 6%.

Further, the second vapor deposition device may further include a first support shaft located outside the second vaporization source and perpendicular to the second vaporization source, and a second support shaft arranged on the first support shaft and configured to move the second baffle in a first direction that the first direction is a horizontal direction; and the controlling the second baffle to close the second vaporization source at the preset closing rate may further include controlling an angle between the second support rod and the first support shaft to control the second baffle to close the second vaporization source at the preset closing rate.

Further, the second vapor deposition device may further include a second support shaft located outside the second vaporization source and arranged perpendicular to the first support shaft, and a second support rod arranged on the second support shaft and configured to move the second baffle in a second direction that the second direction is a vertical direction; and the controlling the second baffle to close the second vaporization source at the preset closing rate may further include controlling an angle between the second support rod and the second support shaft to control the second baffle to close the second vaporization source at the preset closing rate.

Further, the preparation system may further include a third vapor deposition device and a fourth vapor deposition device, and the method may further include: respectively controlling the third vapor deposition device and the fourth vapor deposition device to form a second host material of the hole transport layer and a second doping material doped in the second host material on the hole injection layer, in which the third vapor deposition device is configured to vapor deposite the second host material of the hole transport layer, and the fourth vapor deposition device is configured to vapor deposite the second doping material of the hole transport layer, so that a doping concentration of the second doping material of the hole transport layer gradually decreases in the direction away from the anode, and a doping ratio of the second doping material in the hole transport layer is less than or equal to 6%.

Further, the preparation system may further include a fifth vapor deposition device, a sixth vapor deposition device, a seventh vapor deposition device, an eighth vapor deposition device, a ninth vapor deposition device, and a tenth vapor deposition device, and the method may further include: controlling the fifth vapor deposition device to form an electron blocking layer on the hole transport layer; controlling the sixth vapor deposition device to form an organic light emitting layer on the electron blocking layer; controlling the seventh vapor deposition device to form a hole blocking layer on the organic light emitting layer; controlling the eighth vapor deposition device to form an electron transport layer on the hole blocking layer; controlling the ninth vapor deposition device to form an electron injection layer on the electron transport layer; and controlling the tenth vapor deposition device to form a cathode on the electron injection layer.

A sixth embodiment of the present disclosure provides a computer readable storage medium which has a computer program stored thereon, in which the program is executed by a processor to implement the above method.

A seventh embodiment of the present disclosure provides a computer equipment, which includes a memory, a processor, and a computer program stored on the memory and executable on the processor, in which the processor executes the program to implement the above method.

The present disclosure have the following advantageous effects.

In view of the current existing problems, the present disclosure develops an organic light emitting device, and sets the doping material of the hole injection layer in the organic layer to have a gradual doping concentration in the direction away from the anode to improve the charge transport characteristics and reduce the power consumption of the organic light emitting device, and to improve the luminous efficiency and the luminous stability; and the hole injection layer with the gradual doping concentration of the present disclosure further reduces the doping ratio of the doping material in the hole injection layer as compared with the hole injection layer in the prior art with the uniform doping concentration, can effectively alleviate the crosstalk problem in the prior art, improve the display effect, and has a wide range of application prospects.

BRIEF DESCRIPTION OF THE DRAWINGS

In order to explain the technical solutions in the embodiments of the present disclosure more clearly, the following will briefly introduce the drawings needed in the description of the embodiments. Obviously, the drawings in the following description are merely some embodiments of the present disclosure. For those skilled in the art, other drawings can be obtained based on these drawings without creative work.

DETAILED DESCRIPTION

In order to explain the present disclosure more clearly, the following further describes the present disclosure in combination with preferred embodiments and the accompanying drawings. Similar components in the drawings are denoted by the same reference numerals. Those skilled in the art should understand that the content described below is illustrative rather than restrictive, and should not be used to limit the protection scope of the present disclosure.

It should be noted that the "on", "formed on" and "arranged on" used herein can mean that a layer is directly formed or arranged on another layer, or it can mean that a layer is indirectly formed or arranged on another layer, that is, there are other layers between the two layers. Moreover, the relational terms such as first and second used herein are only used to distinguish one entity or operation from another entity or operation, and do not necessarily require or imply that there is any such actual relationship or order between these entities or operations. Moreover, the terms "include", "comprise" or any other variants thereof are intended to cover non-exclusive inclusion, so that a process, method, article or equipment including a series of elements not only includes those elements, but also includes those that are not explicitly listed, or also include elements inherent to this process, method, article or equipment. If there are no more restrictions, the element defined by the sentence "including a . . . " does not exclude the existence of other identical elements in the process, method, article, or equipment that includes the element.

Organic light emitting device in the prior art has the phenomenon of low luminous efficiency and instability. The reason for this phenomenon is that the charge transport characteristics of the organic layer of the organic light emitting device are poor. Since the molecules in the organic material of the organic layer are combined with very weak chemical bonds, the energy levels between molecules cannot form energy bands like solids, but can only exist in discrete forms, resulting in the problems of poor conductivity and low charge mobility in the organic layer.

At present, in order to improve the charge mobility of the organic layer in the organic light emitting device, a method of uniformly doping the hole injection layer in the organic layer is adopted. However, the organic light emitting device prepared in this doping method still has low luminous efficiency and instability, and the inventors found that the organic light emitting device also has the problem of crosstalk due to excessive doping materials.

In response to the above problems, the inventors proposed an organic light emitting device, a display device, a preparation method, and a storage medium to solve the above problems after extensive experiments and research.

Figure 1:
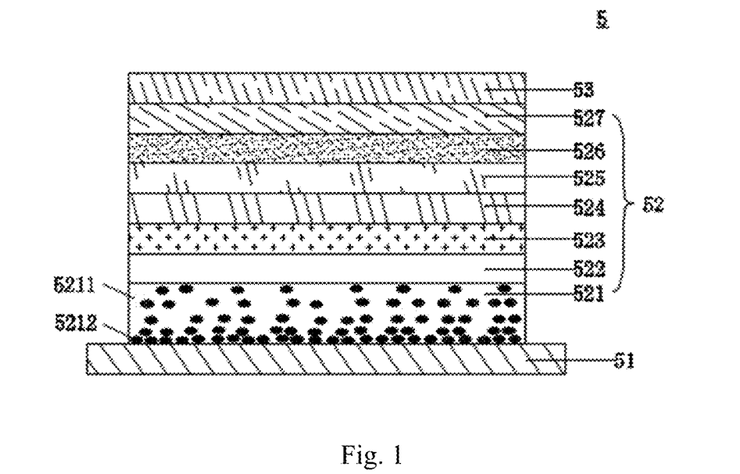
FIG. 1 is a schematic view showing a layer structure of an organic light emitting device according to an embodiment of the present disclosure.

As shown in FIG. 1, an embodiment of the present disclosure provides an organic light emitting device 5, which includes an anode 51, an organic layer 52 and a cathode 53, which are arranged in a stack.

In the organic light emitting device 5, the organic layer 52 includes a hole injection layer 521, a hole transport layer 522, an electron blocking layer 523, an organic light emitting layer 524, a hole blocking layer 525, an electron transport layer 526, and an electron injection layer 527, which are sequentially arranged in a stack on the anode 51. The hole injection layer 521 includes a first host material 5211 and a first doping material 5212 doped in the first host material 5211, and a doping concentration of the first doping material 5212 gradually decreases in a direction away from the anode 51, and a doping ratio of the first doping material in the hole injection layer is less than or equal to 6%.

In this embodiment, on the one hand, the doping material of the hole injection layer in the organic layer is set to have a gradual doping concentration in the direction away from the anode so as to improve the charge transport characteristics and reduce the power consumption of the organic light emitting device, and to improve the luminous efficiency and the luminous stability; and on the other hand, the hole injection layer with gradual doping concentration of the present disclosure can further reduce the doping ratio of the doping material in the hole injection layer as compared with the hole injection layer in the prior art with the uniform doping concentration, and can effectively alleviate the crosstalk problem in the prior art, improve the display effect, and has a wide range of application prospects.

In an optional embodiment, the first host material may be at least one of hexaazatriphenylenehexacarbonitrile (HATCN), copper phthalocyanine (CuPc), and radialene-based materials. In another optional embodiment, the first doping material is at least one of P-type materials, that is, it includes hole-type materials. Specifically, it includes NPB:F4TCNQ material, where NPB is N,N'-bis-(1-naphthalenyl)-N,N'-bisphenyl-1,1'-biphenyl-4,4'-diamine, and F4TCNQ is 2,3,5,6-tetrafluoro-7,7',8,8'-tetracyanoquinodimethane; or includes TAPC:MnO$_3$ material, where TAPC is 4,4'-cyclohexylidenebis(N,N-bis(4-methylphenyl)aniline, and MnO$_3$ is molybdenum oxide material. Those skilled in the art select the first host material and the first doping material according to actual applications, which will not be repeated herein.

Corresponding to the organic light emitting device provided in this embodiment of the present disclosure, another embodiment of the present disclosure also provides a method for preparing the organic light emitting device, which includes: forming a hole injection layer 521, a hole transport layer 522, an electron blocking layer 523, an organic light emitting layer 524, a hole blocking layer 525, an electron transport layer 526, and an electron injection layer 527, which are sequentially arranged in a stack on an anode 51 of the organic light emitting device, in which the hole injection layer 521 includes a first host material 5211 and a first doping material 5212 doped in the first host material 5211, a doping concentration of the first doping material 5212 gradually decreases in a direction away from the anode 51, and a doping ratio of the first doping material in the hole injection layer is less than or equal to 6%.

In this embodiment, the first doping material 5212 in the hole injection layer 521 has a higher doping concentration on a side proximate to the anode 51. This setting can effectively control the doping concentration of the first doping material 5212 in the hole injection layer 521 at a position in contact with the anode 51, so as to avoid the crosstalk problem caused by the excessive doping concentration at the position.

As the distance from the anode 51 gets farther and farther, the doping concentration of the first doping material 5212 is also proportionally reduced, which can effectively control the overall concentration of the first doping material 5212 in the hole injection layer 521. At the same time, the doping ratio of the first doping material in the hole injection layer is less than or equal to 6%, which can improve the charge transport characteristics, reduce the power consumption of the organic light emitting device, and improve the luminous efficiency and luminous stability.

Then, a cathode is further formed on the electron injection layer 527, thereby forming the organic light emitting device according to the embodiment of the present disclosure.

Figure 2A:
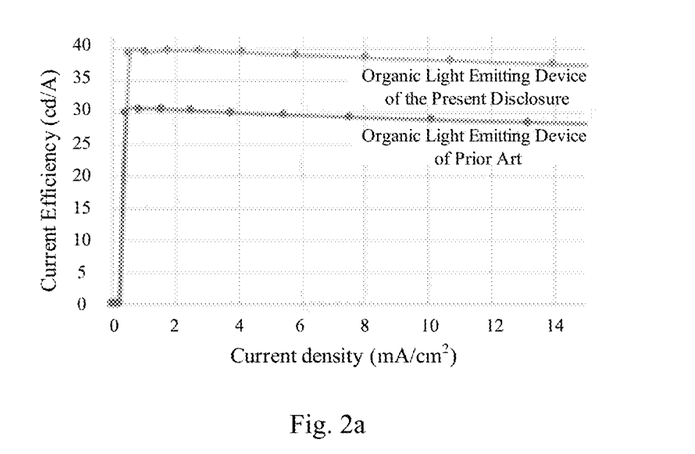
FIGS. 2a and 2b are schematic views showing performance comparison between an organic light emitting device according to an embodiment of the present disclosure and an organic light emitting device in the prior art.
Figure 2B:
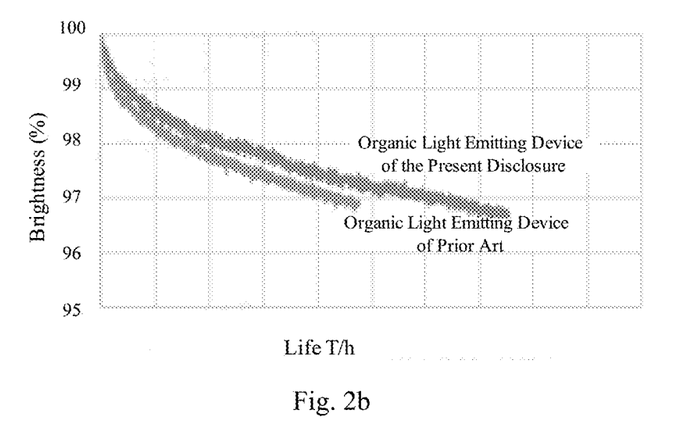

In this embodiment, the organic light emitting device formed by the above method is compared with the light emitting device of the prior art, and the obtained performance comparison results are shown in FIG. 2*a*, FIG. 2*b* and Table 1. Table 1 shows the performance of organic light emitting devices under current density J=15 mA/cm$^2$.

TABLE 1

| Device | Voltage (V) | Current Efficiency (cd/A) | Color Coordinate X | Color Coordinate Y | Electronic Spectrum (nm) | External Quantum Efficiency (EQE) |
|---|---|---|---|---|---|---|
| Example 1 | 4.83 | 37.19 | 0.283 | 0.677 | 524 | 10.53% |
| Prior Art Example 1 | 5.14 | 29.72 | 0.288 | 0.671 | 524 | 8.44% |

As shown in FIG. 2*a*, under the same current density, the organic light emitting device of this embodiment has higher current efficiency than that of the organic light emitting device of the prior art. As shown in FIG. 2*b*, the normalized brightness and the life curve of the organic light emitting device of this embodiment are both improved as compared with the performance of the organic light emitting device of the prior art. At the same time, as can be seen from Table 1, under the same current density, the organic light emitting device of this embodiment has the characteristics of lower driving voltage, high current efficiency, and high luminous efficiency than the existing organic light emitting device. Therefore, the organic light emitting device of this embodiment and the organic light emitting device formed by the above method can improve the charge transport characteristics, reduce the power consumption of the organic light emitting device, improve the luminous efficiency and luminous stability, and can also alleviate the crosstalk problem, and has broad application prospects.

It is worth noting that the organic light emitting device proposed in the embodiment of the present disclosure is not limited to the specific structure formed by the above preparation method of the present disclosure, and the specific structure of the above organic light emitting device can also be formed by those skilled in the art using other processing techniques.

Figure 3:
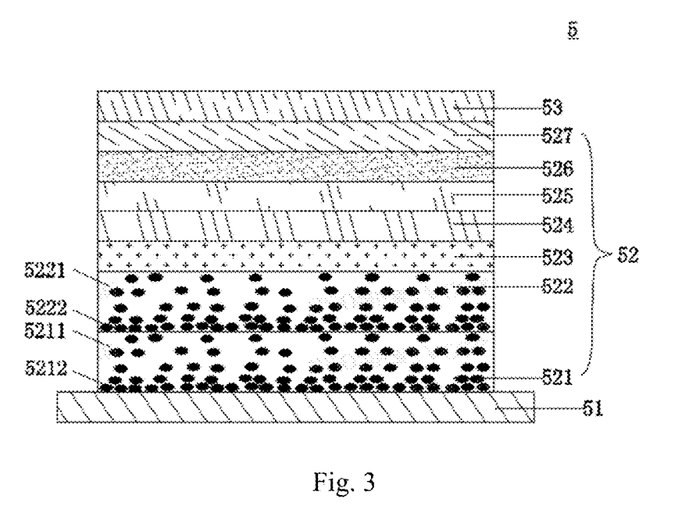
FIG. 3 is a schematic view showing a layer structure of an organic light emitting device according to another embodiment of the present disclosure.

In an optional embodiment, as shown in FIG. 3, the hole transport layer 522 includes a second host material 5221 and a second doping material 5222 doped in the second host material 5221. The doping concentration of the second doping material 5222 gradually decreases in the direction away from the anode 51, and a doping ratio of the second doping material in the hole transport layer is less than or equal to 6%.

In this embodiment, the organic light emitting device, on the basis of including a hole injection layer with a graded doping concentration of the first doping material, further forms a hole transport layer with a graded doping concentration of the second doping material. On the one hand, this further improves the charge transport characteristics of the organic light emitting device, reduces the power consumption of the organic light emitting device, and improves the luminous efficiency and luminous stability; on the other hand, the hole transport layer with the gradual doping concentration can further reduce the doping ratio as compared with the uniformly doped hole transport layer in the prior art, can further alleviate the crosstalk problem and improve the display effect, and has broad application prospects.

In this embodiment, the second host material may be at least one of hexaazatriphenylenehexacarbonitrile (HATCN), copper phthalocyanine (CuPc), and radialene-based materials, and the second doping material is at least one of P-type materials, including NPB:F4TCNQ material or TAPC:MnO$_3$ material.

In a specific example, the preparing steps of the hole transport layer are described as follows. A hole transport layer is formed on the hole injection layer, and the second doping material 5222 of the hole transport layer 522 has a higher doping concentration on the side proximate to the anode 51.

In this embodiment, as the distance from the hole injection layer 521 gets further and further, the doping concentration of the second doping material 5222 is also proportionally reduced, which effectively controls the overall concentration of the second doping material 5222 in the hole transport layer 522, that is, a hole transport layer with a graded doping concentration of the second doping material is formed, so that the hole injection layer with the first doping material and the hole transport layer with the second doping material contribute to further alleviating the crosstalk problem caused by excessive doping concentration in the prior art, effectively reducing the power consumption of the organic light emitting device, and improving the luminous efficiency and luminous stability.

A cathode is further formed on the organic layer, thereby forming the organic light emitting device of the embodiment of the present disclosure. The organic light emitting device, on the basis of having the hole injection layer with a graded doping concentration of the first doping material, further forms a hole transport layer with a graded doping concentration of a second doping material in which the doping ratio of the second doping material in the hole transport layer is less than or equal to 6%, can further improve the charge transport characteristics of the organic light emitting device, reduce the power consumption of the organic light emitting device, improve the luminous efficiency and luminous stability, can further alleviate the crosstalk problem, and has wide application prospects.

Figure 4:
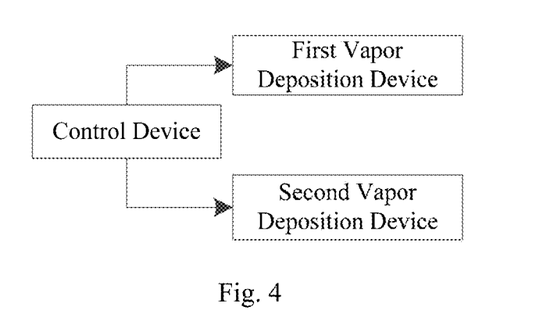
FIG. 4 is a structural frame diagram showing a preparation system according to another embodiment of the present disclosure.

Corresponding to the above organic light emitting device, another embodiment of the present disclosure provides a preparation system, as shown in FIG. 4, which includes a first vapor deposition device, a second vapor deposition device, and a control device configured to control the first vapor deposition device and the second vapor deposition device, in which the first vaporization device is configured to vapor deposit a first host material 5211 of a hole injection layer 521 of an organic light emitting device, and includes a first vaporization source and a first baffle arranged between the first vaporization source and the organic light emitting device; the second vaporization device is configured to vapor deposit a first doping material 5212 of the hole injection layer 521 of the organic light emitting device, and includes a second vaporization source and a second baffle arranged between the second vaporization source and the organic light emitting device; and the control device is configured to respectively control the first vaporization source and the first baffle as well as the second vaporization source and the second baffle to form a first host material 5211 of the hole injection layer 521 and the first doping material 5212 doped in the first host material 5211 on an anode 51 of the organic light emitting device, so that a doping concentration of the first doping material 5212 of the hole injection layer 521 gradually decreases in a direction away from the anode 51, and a doping ratio of the first doping material in the hole injection layer is less than or equal to 6%.

In this embodiment, the first vapor deposition device and the second vapor deposition device are controlled by the control device to form the hole injection layer including the first doping material with a graded doping concentration of the first doping material.

In a specific example, when the vapor deposition material is vapor deposited from bottom to top to form the hole injection layer of the organic light emitting device, the first vapor deposition device and the second vapor deposition device are located below the organic light emitting device. In another specific example, when the vapor deposition material is vapor deposited from top to bottom to form the hole injection layer of the organic light emitting device, the first vapor deposition device and the second vapor deposition device are located above the organic light emitting device. Those skilled in the art sets the position between the vapor deposition device and the organic light emitting device according to actual functional requirements, which will not be repeated herein.

Taking the first vapor deposition device and the second vapor deposition device below the organic light emitting device as an example, the specific process of preparing the organic light emitting device of the embodiment of the present disclosure using the preparation system will be described.

First, a hole injection layer is vapor deposited on a substrate on which an anode 51 is formed, in which the anode material is indium tin oxide, the substrate is subjected to a deionized water cleaning process and a UV ozone treatment process, and then the hole injection layer 521 is vapor deposited.

Specifically, the control device controls the first vapor deposition device and the second vapor deposition device to open the first baffle and the second baffle respectively, and the control device controls a rate of the first vaporization source of the first vapor deposition device to reach and be stabilized at a first preset rate, and controls a rate of the second vaporization source of the second vapor deposition device to reach and be stabilized at a second preset rate, and the second preset rate is 10% of the first preset rate.

Under the control of the control device, the first vaporization source is turned on and its rate is stabilized at the first preset rate. In a specific example, the first preset rate is in a range from 0.2 to 2 angstroms/sec. At the same time, under the control of the control device, the second vaporization source is turned on and its rate is stabilized at the second preset rate. In a specific example, the second preset rate is in a range from 0 to 0.5 angstroms/sec, specifically 10% of the first preset rate. For example, when the first preset rate is stabilized at 2 angstroms/sec, the second preset rate is stabilized at 0.2 angstroms/sec.

Further, on the basis that the rates of the first vaporization source and the second vaporization source both reach the corresponding preset rate, the control device respectively controls the first vapor deposition device and the second vapor deposition device to form the first host material of the hole injection layer and the first doping material doped in the first host material on the anode of the organic light emitting device.

Figure 5A:
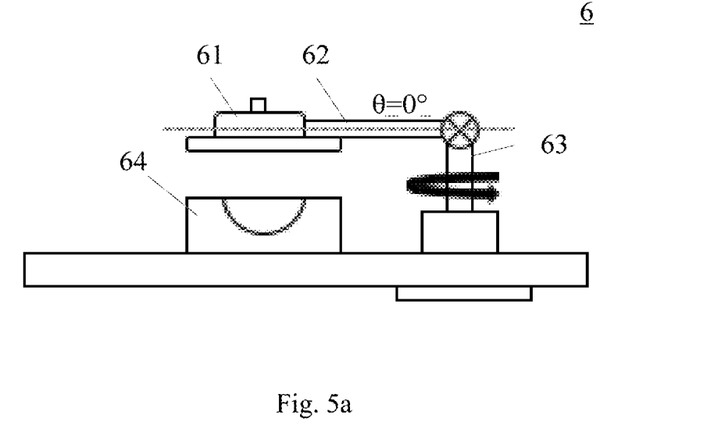
FIGS. 5a to 5d are schematic views and multi-angle top views showing a vapor deposition device rotating in a first direction according to an embodiment of the present disclosure.

In an optional embodiment, the second vapor deposition device 6 is shown in FIG. 5a, and the second vapor deposition device 6 includes a first support shaft 63 located outside the second vaporization source 64 and arranged perpendicular to the second vaporization source, and a second support rod 62 of the second vapor deposition device arranged on the first support shaft 63 and configured to move the second baffle 61 in the first direction.

Figure 5B:
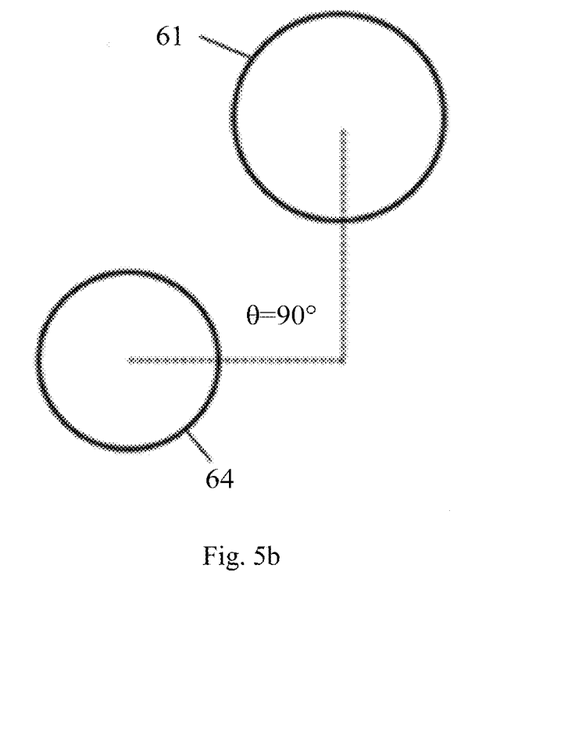

As shown in FIG. 5a, the first direction in this embodiment is the horizontal direction. Under the control of the control device, the second support rod 62 of the second vapor deposition device drives the second baffle 61 to rotate around the first support shaft 63 in the horizontal direction, so as to change the blocked area of the second vaporization source 64. FIG. 5b is a schematic view showing the second vapor deposition device from a top view. The second support rod 62 forms a first rotation angle θ when rotating around the first support shaft 63 in the horizontal direction. When the first vaporization source stabilizes at the first preset rate, and the second preset rate stabilizes at the second preset rate, as shown in FIG. 5b, the first rotation angle θ is about in a range from 85° to 90° at this time, the second baffle is in a fully opened state, and the second vaporization source 64 is not blocked.

In this embodiment, the structure and principle of the second vapor deposition device are the same as the structure and principle of the first vapor deposition device, which will not be repeated herein. At this time, the first baffle is also in a fully opened state under the control of the control device.

The first vaporization source vapor deposites the first host material on the anode in response to the instruction of the control device, and the second vaporization source vapor deposites the first doping material doped in the first host material on the anode in response to the instruction of the control device.

Furthermore, the control device controls the first vapor deposition device to perform vapor deposition at a first preset rate, controls the second vaporization source to cool down at a preset cooling rate, and controls the second baffle to close the second vaporization source at a preset closing rate, so that the doping concentration of the first doping material 5212 of the hole injection layer 521 gradually decreases in the direction away from the anode 51.

In this embodiment, the vapor deposition rate of the first vapor deposition device does not change, and the rotation angle does not change. Therefore, the first vapor deposition device performs vapor deposition of the first host material in a state where the first baffle is fully opened.

Figure 5C:
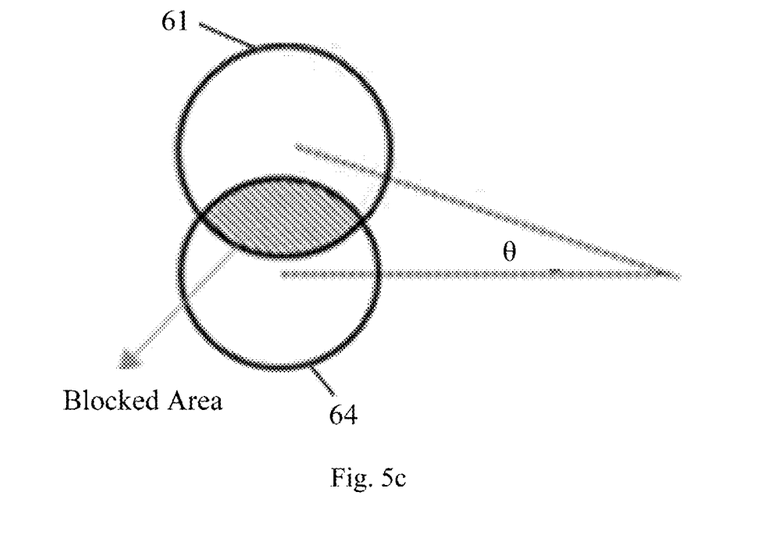

In an optional embodiment, the control device controls the angle (i.e., the rotation angle) formed when the second support rod 62 rotates around the first support shaft 63 in the horizontal direction, so as to control the second baffle to close the second vaporization source at a preset closing rate.

Figure 5D:
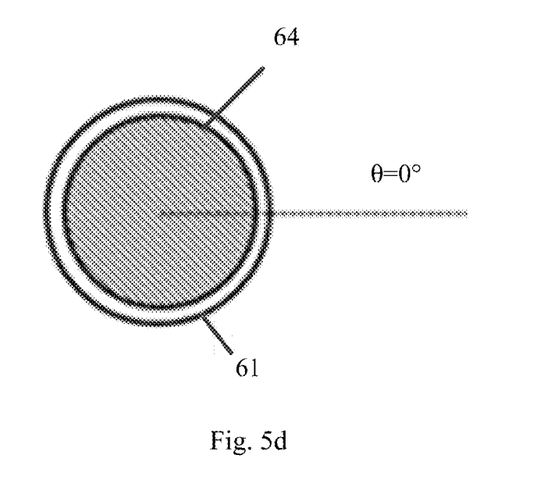

Under the control of the control device, as shown in FIG. 5c, the first rotation angle θ becomes smaller, and the second baffle 61 is closed at a preset closing rate to gradually block the second vaporization source 64. The vapor deposition area of the second vaporization source changes accordingly. As shown in FIG. 5d, when the second baffle 61 of the second vapor deposition device rotates to be right above the second vaporization source 64, the first rotation angle θ is 0°. At this time, the second baffle 61 is completely closed under the drive of the second support rod 62, to completely block the second vaporization source 64. Under the control of the control device, the change of the first rotation angle θ causes the blocked area to be changed accordingly when the second baffle is closed at the preset closing rate, so as to realize the change of the vapor deposition area of the second vaporization source, so that different vapor deposition area corresponds to different vapor deposition amounts, that is, the doping concentration per unit area is also different. Thus, the second vaporization source is closed at the preset closing rate by controlling the second baffle, to realize the change of the doping concentration of the first doping material and set the doping ratio of the first doping material in the hole injection layer to be less than or equal to 6%.

Figure 6:
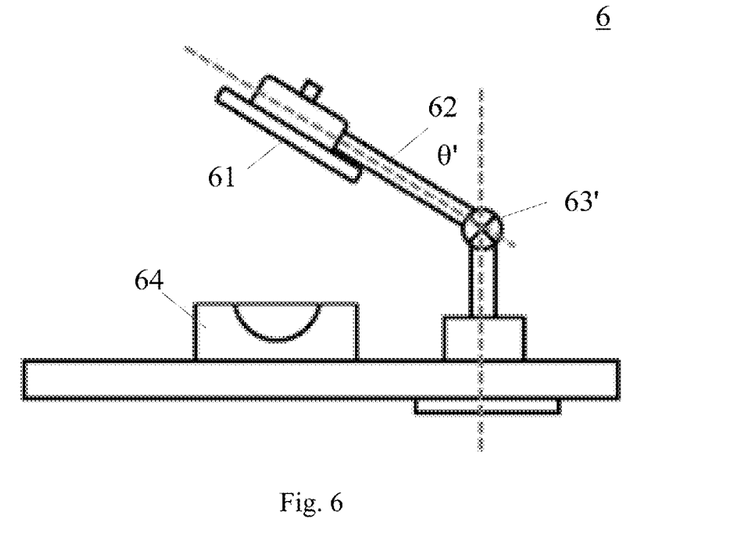
FIG. 6 is a schematic top view showing a vapor deposition device rotating in a second direction according to an embodiment of the present disclosure.

In another optional embodiment, as shown in FIG. 6, the second vapor deposition device 6 further includes a second support shaft 63' located outside the second vaporization source 64 and arranged perpendicular to the first support shaft 63, and a second support rod 62 arranged on the second support shaft 63' and configured to move the second baffle 61 in the second direction.

In this embodiment, as shown in FIG. 6, the second direction is the vertical direction. The angle formed by the axis of the second support rod 62 of the second vapor deposition device and the axis of the first support shaft 63, away from the second vaporization source 64, is the second rotation angle θ'. When the second rotation angle θ' is 90°, the second baffle 61 of the second vapor deposition device 62 is located right above the second vaporization source 64, and the second baffle 61 completely blocks the second vaporization source 64. When the second rotation angle θ' is 0°, the axis of the first support shaft 63 coincides with the axis of the second support rod 62, and the second baffle 61 is fully opened without blocking the second vaporization source. Under the control of the control device, the second support rod 62 rotates around the second support shaft 63' in the vertical direction, and the rotation angle is changed between 0° and 90°, so that the blocked area of the second vaporization source gradually changes when the second baffle of the second vapor deposition device is closed at the preset closing rate, so that different vapor deposition areas correspond to different doping concentrations, so as to realize the change of the doping concentration of the first doping material, and set the doping ratio of the first doping material in the hole injection layer to be less than or equal to 6%.

The structure and working principle of the first vapor deposition device are the same as those of the second vapor deposition device, and will not be repeated herein. Those skilled in the art select the structure of the first vapor deposition device and the second vapor deposition device according to the actual application, so as to take that the first vapor deposition device and the second vapor deposition device forms a hole injection layer with a graded doping concentration of the second doping material under the control of the control device as a design criterion, which will not be repeated herein.

While controlling the second vapor deposition baffle to close the second vaporization source at the preset closing rate, the control device also controls the temperature of the second vaporization source to control the doping concentration of the first doping material, so that the doping ratio of the first doping material in the hole injection layer is less than or equal to 6%.

Figure 7:
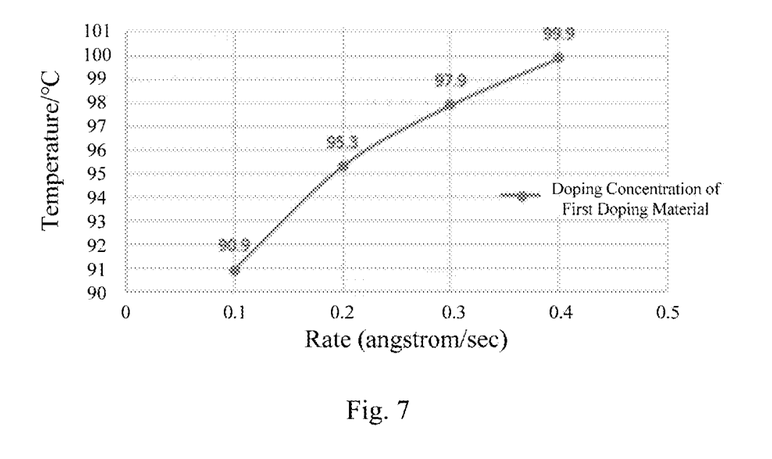
FIG. 7 is a graph showing the variation curve of a doping concentration of a first doping material relative to a temperature of a vaporization source and a rate of a vaporization source according to an embodiment of the present disclosure.

In a specific example, FIG. 7 shows the temperature and rate change curve of the first doping material 5212. As can be seen from FIG. 7, the vapor deposition rate of the second vaporization source increases as the temperature increases, and as the vapor deposition rate of the second vaporization source increases, the doping concentration of the first doping material in the first host material increases accordingly. Therefore, in the embodiment of the present disclosure, by gradually lowering the vapor deposition temperature of the second vaporization source during the vapor deposition process, the doping concentration of the first doping material can also be gradually reduced in the direction away from the anode.

During the vapor deposition process, the vapor deposition temperature of the second vaporization source is gradually lowered at a preset cooling rate. In a specific example, the preset cooling rate is in a range from 0.5 to 5° C./s. As the vapor deposition time increases, the hole injection layer 521 is vapor deposited to a predetermined film thickness, and the doping concentration of the first doping material 5212 formed in the first host material 5211 gradually decreases in the direction away from the anode 51, thereby forming a hole injection layer with a graded doping concentration.

In this embodiment, the second baffle is closed at the preset closing rate and the vapor deposition temperature of the second vaporization source is reduced at the preset cooling rate, to control the doping concentration of the first doping material to gradually decrease in a direction away from the anode, and set the doping ratio of the first doping material in the hole injection layer to be less than or equal to 6%, so that the amount of change and the rate of change in the doping concentration of the first doping material and the doping ratio are accurately controlled. The present disclosure does not specifically limit the preset closing rate of the second baffle and preset cooling rate of the second vapor deposition device, and those skilled in the art could set the preset cooling rate and the preset closing rate according to actual applications, which will not be repeated herein.

Further, a hole transport layer 522, an electron blocking layer 523, an organic light emitting layer 524, a hole blocking layer 525, an electron transport layer 526, and an electron injection layer 527, which are arranged in a stack, and the cathode 53 are sequentially formed on the hole injection layer 521 through a vapor deposition process, to form an organic light emitting device as shown in FIG. 1.

It is worth noting that in the above preparation process, in a specific example, the first vapor deposition device and the second vapor deposition device are located in the same vapor deposition chamber, and the control device can be integrated with a computer or other control device outside the vapor deposition chamber to control the first vapor deposition device and the second vapor deposition device. The control device can also be separately arranged outside the vapor deposition chamber to control the first and second vapor deposition devices. Those skilled in the art could set the control device according to actual needs, and take effective control of the first vapor deposition device and the second vapor deposition device as a design criterion.

In an optional embodiment, as shown in FIG. 3, the doping concentration of the second doping material of the hole transport layer 522 gradually decreases in the direction away from the anode 51, and the preparation system further includes a third vapor deposition device and a fourth vapor deposition device. The preparing the organic light emitting device further includes: respectively controlling the third vapor deposition device and the fourth vapor deposition device to form a second host material 5221 of the hole transport layer 522 and a second doping material 5222 doped in the second host material 5221 on the hole injection layer 521, in which the third vapor deposition device is configured to vapor deposite the second host material 5221 of the hole transport layer 522, and the fourth vapor deposition device is configured to vapor deposite the second doping material 5222 of the hole transport layer 522, so that a doping concentration of the second doping material 5222 of the hole transport layer 522 gradually decreases in the direction away from the anode 51, and a doping ratio of the first doping material in the hole injection layer is less than or equal to 6%.

In a specific example, the structure and working principle of the third vapor deposition device is consistent with the structure and working principle of the first vapor deposition device, and the structure and working principle of the fourth vapor deposition device is consistent with the structure and working principle of the second vapor deposition device. More specifically, the third vapor deposition device and the fourth vapor deposition device can be rotated in the horizontal direction as shown in FIG. 5*a*, and the third vapor deposition device and the fourth vapor deposition device can also be rotated in the vertical direction as shown in FIG. 6. Those skilled in the art could make settings according to actual application requirements, which will not be repeated herein.

In a specific example, the method further includes the followings.

The control device respectively controls the third vapor deposition device and the fourth vapor deposition device to open the third baffle and the fourth baffle, and the control device controls the rate of the third vaporization source of the third vapor deposition device to reach and be stabilized at a third preset rate, and controls the rate of the fourth vaporization source of the fourth vapor deposition device to reach and be stabilized at a fourth preset rate, and the fourth preset rate is 10% of the third preset rate.

On the basis that the rates of the first vaporization source and the second vaporization source both reach the corresponding preset rate, the control device respectively controls the third vapor deposition device and the fourth vapor deposition device to form a second host material of the hole transport layer and a second doping material doped in the second host material on the hole injection layer of the organic light emitting device.

Further, the control device controls the fourth baffle to close the fourth vaporization source at a preset closing rate by controlling the rotation angle of the fourth vapor deposition device. At the same time, the control device can also reduce the vapor deposition temperature of the second vaporization source at a preset cooling rate, so that the doping concentration of the second doping material gradually decreases in the direction away from the anode, and the doping ratio of the second doping material in the hole transport layer is less than or equal to 6%, so that the amount of change and the rate of change in the doping concentration of the second doping material and the doping ratio are accurately controlled.

In the hole transport layer 522 formed by this method, the second doping material 5222 has a higher doping concentration on the side proximate to the anode 51, which further alleviates the crosstalk problem caused by the excessive doping concentration at this position; as the distance from the hole injection layer 521 gets further and further, the doping concentration of the second doping material 5222 also decreases proportionally. Moreover, the doping ratio of the second doping material in the hole transport layer of this embodiment is less than or equal to 6%, which can further reduce the power consumption of organic light emitting devices, improve the luminous efficiency and the luminous stability, and has broad application prospects.

It is worth noting that the present disclosure does not specifically limit the first host material and the second host material, nor does it specifically limit the first doping material and the second doping material. Those skilled in the art should select appropriate host material and doping material according to actual application requirements, to meet the design criterion that the doping concentration of the doping material in the host material gradually decreases in the direction away from the anode, which will not be repeated herein.

In a specific example, the second host material is the same as the first host material, and the second doping material is the same as the first doping material. The hole transport layer of this embodiment can be prepared by the same preparation system, that is, the hole injection layer and the hole transport layer are prepared by the first vapor deposition device and the second vapor deposition device for preparing the hole injection layer, the doping concentration of the first doping material in the hole injection layer and the hole transport layer gradually decreases in a direction away from the anode, for example, the hole injection layer and the hole transport layer as shown in FIG. 3 can be formed. The hole injection layer and the hole transport layer can also be formed as a whole film layer in which the doping concentration gradually decreases in the direction away from the anode, thereby simplifying the preparation process.

In an optional embodiment, the preparation system further includes a fifth vapor deposition device, a sixth vapor deposition device, a seventh vapor deposition device, an eighth vapor deposition device, a ninth vapor deposition device, and a tenth vapor deposition device, to prepare the electron blocking layer 523, the organic light emitting layer 524, the hole blocking layer 525, the electron transport layer 526, and the electron injection layer 527 shown in FIGS. 1 and 3. On the basis of forming the hole injection layer and the hole transport layer of the organic layer by using the above method, the preparation method further includes the followings.

The control device controls the fifth vapor deposition device to form an electron blocking layer 523 on the hole transport layer 522. The electron blocking layer is configured to transfer holes and block electrons and excitons generated in the organic light emitting layer. In a specific example, the thickness of the electron blocking layer is in a range from 1 to 10 nm.

The control device controls the sixth vapor deposition device to form an organic light emitting layer 524 on the electron blocking layer 523. The organic light emitting layer is configured to recombine the transported holes and electrons in the organic light emitting layer to generate excitons, and to use the excitons to transfer energy to the luminous object to achieve luminescence.

The control device controls the seventh vapor deposition device to form a hole blocking layer 525 on the organic light emitting layer 524. The hole blocking layer is configured to block holes and excitons generated in the organic light emitting layer. In a specific example, the thickness of the hole blocking layer is in a range from 2 to 10 nm.

The control device controls the eighth vapor deposition device to form the electron transport layer 526 on the hole blocking layer 525. In a specific example, a thickness of the electron blocking layer is in a range from 20 to 70 nm, and a material of the electron transport layer can be prepared by using one or more of thiophenes, imidazoles, and azine derivatives, and by blending with quinolinolato lithium, in which a proportion of quinolinolato lithium is in a range from 30% to 70%.

The control device controls the ninth vapor deposition device to form an electron injection layer 527 on the electron transport layer 526. In a specific example, the thickness of the electron injection layer is in a range from 0.5 nm to 2 nm, and the material is made of LiF, LiQ, Yb, Ca and other materials.

The control device controls the tenth vapor deposition device to form a cathode 53 on the electron injection layer 527, thereby forming an organic light emitting device as shown in FIG. 1 or FIG. 3. In a specific example, if the organic light emitting device has a top-emitting structure, the thickness of the cathode may be in a range from 10 nm to 20 nm, and the material may be one or more of magnesium, silver, and aluminum, in which the ratio of magnesium to silver is in a range from 3:7 to 1:9. In another specific example, if the organic light emitting device has a bottom emission structure, the thickness of the electron injection layer needs to be greater than 80 nm, to ensure the reflectivity of the organic light emitting device.

The organic light emitting device of this embodiment has a hole injection layer in which the doping concentration of the first doping material gradually decreases in the direction away from the anode and a hole transport layer in which the doping concentration of the second doping material gradually decreases in the direction away from the anode, which can improve charge transfer characteristics. It reduces the power consumption of organic light emitting devices, improves luminous efficiency and luminous stability, and has broad application prospects.

In this embodiment, each vapor deposition device can be set in the same vapor deposition chamber or in different chambers. Those skilled in the art can set each vapor deposition device according to actual applications.

Figure 8:
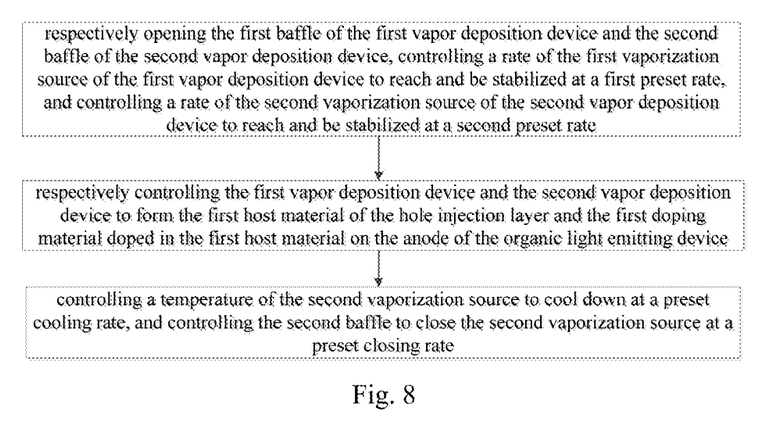
FIG. 8 is a flowchart showing a preparation method for preparing an organic light emitting device using the above preparation system according to another embodiment of the present disclosure.

Corresponding to the preparation system provided in the above embodiment, an embodiment of the present disclosure also provides a preparation method for preparing the above organic light emitting device using the above preparation system. As shown in FIG. 8, the method includes: respectively opening the first baffle of the first vapor deposition device and the second baffle of the second vapor deposition device, controlling a rate of the first vaporization source of the first vapor deposition device to reach and be stabilized at a first preset rate, and controlling a rate of the second vaporization source of the second vapor deposition device to reach and be stabilized at a second preset rate, in which the second preset rate is 10% of the first preset rate; respectively controlling the first vapor deposition device and the second vapor deposition device to form the first host material of the hole injection layer and the first doping material doped in the first host material on the anode of the organic light emitting device; and controlling a temperature of the second vaporization source to cool down at a preset cooling rate, and controlling the second baffle to close the second vaporization source at a preset closing rate, so that a doping concentration of the first doping material of the hole injection layer gradually decreases in the direction away from the anode, and a doping ratio of the first doping material in the hole injection layer is less than or equal to 6%.

The preparation method of this embodiment has a simple manufacturing process, adopts common processing techniques, and has high processing efficiency. In the organic light emitting device formed by the preparation method of this embodiment, the first doping material in the hole injection layer has a higher doping concentration on the side proximate to the anode, which can effectively control the doping concentration of the first doping material in the hole injection layer at a position in contact with the anode during processing, so as to avoid the crosstalk problem caused by the excessive doping concentration at this position. As the distance from the surface of the hole injection layer to the anode gets further and further during processing, the doping concentration of the first doping material is also proportionally reduced, the overall concentration of the first doping material in the hole injection layer is effectively controlled, which improves the charge transport characteristics, reduces the power consumption of the organic light emitting device, improves the luminous efficiency and luminous stability, and has broad application prospects.

In an optional embodiment, the second vaporization device further includes a first support shaft located outside the second vaporization source and perpendicular to the second vaporization source, and a second support shaft arranged on the first support shaft and configured to move the second baffle in a first direction that the first direction is a horizontal direction; and the controlling the second baffle to close the second vaporization source at the preset closing rate further includes controlling an angle between the second support rod and the first support shaft to control the second baffle to close the second vaporization source at the preset closing rate.

In another optional embodiment, the second vaporization device further includes a second support shaft located outside the second vaporization source and arranged perpendicular to the first support shaft, and a second support rod arranged on the second support shaft and configured to move the second baffle in a second direction that the second direction is a vertical direction; and the controlling the second baffle to close the second vaporization source at the preset closing rate further includes controlling an angle between the second support rod and the second support shaft to control the second baffle to close the second vaporization source at the preset closing rate.

Those skilled in the art could select the structure of the second vapor deposition device according to the actual application, which will not be repeated herein.

The preparation system further includes a third vapor deposition device and a fourth vapor deposition device, and the method further includes the following aspects.

In an optional embodiment, the preparation system further includes a third vapor deposition device and a fourth vapor deposition device, and the method further includes: respectively controlling the third vapor deposition device and the fourth vapor deposition device to form a second host material of the hole transport layer and the second doping material doped in the second host material on the hole injection layer, in which the third vapor deposition device is configured to vapor deposite the second host material of the hole transport layer, and the fourth vapor deposition device is configured to vapor deposite the second doping material of the hole transport layer, so that a doping concentration of the second doping material of the hole transport layer gradually decreases in the direction away from the anode, and a doping ratio of the second doping material in the hole transport layer is less than or equal to 6%.

In an optional embodiment, the preparation system further includes a fifth vapor deposition device, a sixth vapor deposition device, a seventh vapor deposition device, an eighth vapor deposition device, a ninth vapor deposition device, and a tenth vapor deposition device, and the method further includes: controlling the fifth vapor deposition device to form an electron blocking layer on the hole transport layer; controlling the sixth vapor deposition device to form an organic light emitting layer on the electron blocking layer; controlling the seventh vapor deposition device to form a hole blocking layer on the organic light emitting layer; controlling the eighth vapor deposition device to form an electron transport layer on the hole blocking layer; controlling the ninth vapor deposition device to form an electron injection layer on the electron transport layer; and controlling the tenth vapor deposition device to form a cathode on the electron injection layer.

The processing method of this embodiment has simple process flow and high production efficiency. The organic light emitting device formed by the method can improve the charge transfer characteristics, reduce the power consumption of the organic light emitting device, and improve the luminous efficiency and luminous stability, and has broad application prospects.

It is worth noting that the organic light emitting device proposed in the embodiment of the present disclosure is not limited to the specific structure formed by the above preparation method of the present disclosure, and the specific structure of the above organic light emitting device can also be formed by those skilled in the art using other processing techniques.

Since the preparation method of the organic light emitting device provided by the embodiment of the present disclosure corresponds to the organic light emitting device provided in the above several embodiments, the previous embodiments are also applicable to the organic light emitting device provided in this embodiment, which will not be repeated in this embodiment.

Another embodiment of the present disclosure also provides a display device which includes the organic light emitting device in the above embodiment. The display device may be various electronic devices with a display screen, including but not limited to, smart phones, tablet computers, laptop portable computers, and desktop computers, which will not be repeated herein.

Another embodiment of the present disclosure provides a computer readable storage medium which has a computer program stored thereon, in which the program is executed by a processor to implement the followings: respectively opening the first baffle of the first vapor deposition device and the second baffle of the second vapor deposition device, controlling a rate of the first vaporization source of the first vapor deposition device to reach and be stabilized at a first preset rate, and controlling a rate of the second vaporization source of the second vapor deposition device to reach and be stabilized at a second preset rate, in which the second preset rate is 10% of the first preset rate; respectively controlling the first vapor deposition device and the second vapor deposition device to form the first host material of the hole injection layer and the first doping material doped in the first host material on the anode of the organic light emitting device; controlling a temperature of the second vaporization source to cool down at a preset cooling rate, and controlling the second baffle to close the second vaporization source at a preset closing rate, so that a doping concentration of the first doping material of the hole injection layer gradually decreases in the direction away from the anode, and a doping ratio of the first doping material in the hole injection layer is less than or equal to 6%.

In practical applications, the computer readable storage medium may adopt one computer readable medium or any combination of a plurality of computer readable media. The computer readable medium may be a computer readable signal medium or a computer readable storage medium. The computer readable storage medium may be, for example, but not limited to, an electrical, magnetic, optical, electromagnetic, infrared, or semiconductor system, apparatus, or device, or a combination of any of the above. More specific examples (non-exhaustive list) of computer readable storage media include: electrical connections with one or more wires, portable computer disks, hard disks, random access memory (RAM), read-only memory (ROM), erasable programmable read only memory (EPROM or flash memory), optical fiber, portable compact disk read only memory (CD-ROM), optical storage device, magnetic storage device, or any suitable combination of the above. In this embodiment, the computer readable storage medium may be any tangible medium that contains or stores a program, and the program may be used by or in combination with an instruction execution system, apparatus, or device.

The computer readable signal medium may include a data signal propagated in baseband or as a part of a carrier wave, and a computer readable program code is carried therein. This propagated data signal can adopt many forms, including but not limited to electromagnetic signals, optical signals, or any suitable combination of the above. The computer readable signal medium may also be any computer readable medium other than a computer readable storage medium. The computer readable medium may send, propagate, or transmit the program for use by or in combination with the instruction execution system, apparatus, or device.

The program code contained on the computer readable medium can be transmitted by any suitable medium, including but not limited to, wireless, wire, optical cable, RF, etc., or any suitable combination of the above.

The computer program code used to perform the operations of the present disclosure can be written in one or more programming languages or a combination thereof. The programming languages include object-oriented programming languages, such as Java, Smalltalk, C++, and also includes conventional procedural programming language, such as "C" language or similar programming language. The program code can be entirely executed on the user's computer, partly executed on the user's computer, executed as an independent software package, executed partly on the user's computer and partly on a remote computer, or entirely executed on the remote computer or server. In the case involving a remote computer, the remote computer can be connected to the user's computer through any kind of network, including a local area network (LAN) or a wide area network (WAN), or it can be connected to an external computer (for example, to connect via the Internet by an Internet service provider).

Figure 9:
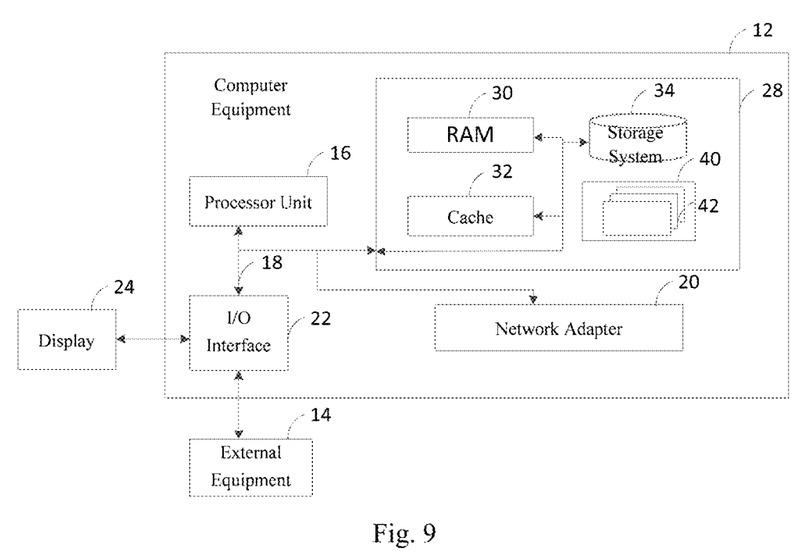
FIG. 9 is a schematic view showing a computer equipment according to another embodiment of the present disclosure.

As shown in FIG. 9, a schematic view shows a computer equipment provided by another embodiment of the present disclosure. The computer equipment 12 shown in FIG. 9 is only an example, and should not bring any limitation to the function and application scope of the embodiment of the present disclosure.

As shown in FIG. 9, the computer equipment 12 is represented in the form of a general-purpose computing device. The components of the computer equipment 12 may include, but are not limited to: one or more processors or processing units 16, a system memory 28, and a bus 18 connecting different system components (including the system memory 28 and the processing unit 16).

The bus 18 represents one or more of several types of bus structures, including a memory bus or a memory control device, a peripheral bus, a graphics acceleration port, a processor, or a local bus using any bus structure among multiple bus structures. For example, these architectures include, but are not limited to, industry standard architecture (ISA) bus, microchannel architecture (MAC) bus, enhanced ISA bus, Video Electronics Standards Association (VESA) local bus, and peripheral component interconnection (PCI) bus.

The computer equipment 12 typically includes a variety of computer system readable media. These media may be any available media that can be accessed by the computer equipment 12, including volatile and nonvolatile media, removable and non-removable media.

The system memory 28 may include computer system readable media in the form of volatile memory, such as random access memory (RAM) 30 and/or cache memory 32. The computer equipment 12 may further include other removable/non-removable, volatile/nonvolatile computer system storage media. For example only, the storage system 34 may be configured to read and write non-removable, non-volatile magnetic media (not shown in FIG. 9 and generally referred to as a "hard drive"). Although it is not shown in FIG. 9, a disk drive for reading and writing to a removable non-volatile disk (such as a "floppy disk") and an optical disc drive for reading and writing to a removable non-volatile optical disk (such as CD-ROM, DVD-ROM, or other optical media) can be provided. In these cases, each drive can be connected to the bus 18 through one or more data media interfaces. The memory 28 may include at least one program product, the program product having a set of (for example, at least one) program modules, and these program modules are configured to perform the functions of the embodiments of the present disclosure.

A program/utility tool 40 having a set of (at least one) program module 42 may be stored in, for example, the memory 28. Such program module 42 includes, but is not limited to, an operating system, one or more application programs, other program modules, and program data, and each of these examples or some combination may include the implementation of a network environment. The program module 42 generally executes the functions and/or methods in the described embodiments of the present disclosure.

The computer equipment 12 may also communicate with one or more external devices 14 (such as a keyboard, pointing device, display 24, etc.), and may also communicate with one or more devices that enable a user to interact with the computer equipment 12, and/or communicate with any device (such as a network card, modem, etc.) that enables the computer equipment 12 to communicate with one or more other computing devices. Such communication can be performed through an input/output (I/O) interface 22. In addition, the computer equipment 12 may also communicate with one or more networks (for example, a local area network (LAN), a wide area network (WAN), and/or a public network, such as the Internet) through the network adapter 20. As shown in FIG. 9, the network adapter 20 communicates with other modules of the computer equipment 12 through the bus 18. It should be understood that although it is not shown in FIG. 9, other hardware and/or software modules can be used in conjunction with the computer equipment 12, including but not limited to: microcode, device drivers, redundant processing units, external disk drive arrays, RAID systems, tapes drives and data backup storage systems, etc.

The processor unit 16 executes various functional applications and data processing, such as implementing a preparation method for preparing an organic light emitting device provided by an embodiment of the present disclosure, by running programs stored in the system memory 28.

It should be noted that the order of the steps of the method for preparing an organic light emitting device provided by the embodiments of the present disclosure can be adjusted appropriately, and the steps can also be added or removed accordingly according to the situation. Any method that can be easily changed by those skilled in the art within the technical scope disclosed by the present disclosure should be covered by the protection scope of the present invention, and therefore will not be repeated herein.

Obviously, the above embodiments of the present disclosure are merely examples to clearly illustrate the present disclosure, and are not intended to limit the implementation of the present disclosure. For those skilled in the art, they can also make amendments or changes in other different forms on the basis of the above description. It is not possible to list all the implementations herein, and thus any obvious amendments or changes derived from the technical solutions of the present disclosure are still within the protection scope of the present disclosure.

What is claimed is:

1. An organic light emitting device, comprising an anode, an organic layer and a cathode, which are arranged in a stack, wherein the organic layer comprises a hole injection layer, a hole transport layer, an electron blocking layer, an organic light emitting layer, a hole blocking layer, an electron transport layer, and an electron injection layer, which are sequentially arranged in a stack on the anode, the hole injection layer comprises a first host material and a first doping material doped in the first host material, a doping concentration of the first doping material gradually decreases in a direction away from the anode, and a doping ratio of the first doping material in the hole injection layer is less than or equal to 6%, and
wherein the hole injection layer comprises a first portion where a doping concentration of the first doping material gradually increases in the direction away from the anode and a second portion where a doping concentration of the first doping material gradually decreases in the direction away from the anode, and the first portion is arranged on a surface of the second portion proximate to the anode.

2. The organic light emitting device of claim 1, wherein the hole transport layer comprises a second host material and a second doping material doped in the second host material, a doping concentration of the second doping material gradually decreases in the direction away from the anode, and a doping ratio of the second doping material in the hole transport layer is less than or equal to 6%.

3. The organic light emitting device of claim 2, wherein the second host material and the first host material are the same or different, and are at least one selected from a group consisting of hexaazatriphenylenehexacarbonitrile, copper phthalocyanine and radialene-based materials.

4. The organic light emitting device of claim 2, wherein the second doping material and the first doping material are the same or different, and are at least one selected from P-type materials.

5. The organic light emitting device of claim 2, wherein the hole transport layer comprises a third portion where a doping concentration of the first doping material gradually increases in the direction away from the anode and a fourth portion where a doping concentration of the first doping material gradually decreases in the direction away from the anode, and the third portion is arranged on a surface of the fourth portion proximate to the anode.

6. A display device, comprising the organic light emitting device of claim 1.

* * * * *